(12) United States Patent
Shankar et al.

(10) Patent No.: US 9,887,699 B2
(45) Date of Patent: Feb. 6, 2018

(54) PROGRAMMABLE LOGIC DEVICE WITH INTEGRATED HIGH VOLTAGE POWER FET

(71) Applicant: AnDAPT, Inc., San Jose, CA (US)

(72) Inventors: Kapil Shankar, Saratoga, CA (US);
Thomas Chan, Saratoga, CA (US);
Patrick J. Crotty, San Jose, CA (US);
John Birkner, Woodside, CA (US)

(73) Assignee: AnDAPT, Inc., San Jose, CA (US)

( * ) Notice: Subject to any disclaimer, the term of this patent is extended or adjusted under 35 U.S.C. 154(b) by 0 days.

(21) Appl. No.: 15/336,177

(22) Filed: Oct. 27, 2016

(65) Prior Publication Data

US 2017/0117900 A1 Apr. 27, 2017

Related U.S. Application Data

(60) Provisional application No. 62/246,751, filed on Oct. 27, 2015, provisional application No. 62/247,286, filed on Oct. 28, 2015, provisional application No. 62/256,009, filed on Nov. 16, 2015.

(51) Int. Cl.
| | |
|---|---|
| *H03K 19/177* | (2006.01) |
| *H03K 19/0175* | (2006.01) |
| *H02M 3/158* | (2006.01) |

(52) U.S. Cl.
CPC ...... *H03K 19/17772* (2013.01); *H02M 3/158* (2013.01); *H03K 19/017509* (2013.01); *H03K 19/1776* (2013.01); *H03K 19/17744* (2013.01)

(58) Field of Classification Search
CPC ....... H03K 19/17772; H03K 19/17744; H03K 19/017509; H03K 19/1776; H02M 3/158

USPC ................................................. 326/37–41, 47
See application file for complete search history.

(56) References Cited

U.S. PATENT DOCUMENTS

| | | | |
|---|---|---|---|
| 4,124,899 A | 11/1978 | Birkner et al. | |
| 4,706,216 A | 11/1987 | Carter | |
| 4,758,745 A | 7/1988 | Elgamal et al. | |
| 4,870,302 A | 9/1989 | Freeman | |
| 5,204,556 A | 4/1993 | Shankar | |
| 5,944,813 A | 8/1999 | Trimberger | |
| 6,970,012 B2 | 11/2005 | Crotty et al. | |
| 7,595,686 B2 * | 9/2009 | Maksimovic | G04F 10/005 |
| | | | 327/176 |
| 7,872,495 B1 * | 1/2011 | Tran | H03K 19/01837 |
| | | | 326/30 |
| 8,044,682 B2 | 10/2011 | Birkner et al. | |

(Continued)

OTHER PUBLICATIONS

Maksimovic, Dragan et al., "Small-Signal Discrete-Time Modeling of Digitally Controlled PWM Converters," IIEEE Transactions on Power Electronics, vol. 22, No. 6, Nov. 2007.

(Continued)

*Primary Examiner* — Dylan White
(74) *Attorney, Agent, or Firm* — Innovation Counsel LLP

(57) ABSTRACT

A programmable logic device (PLD) includes a programmable fabric, a plurality of input/output (I/O) blocks, and a plurality of high voltage power field effect transistors (FETs). The PLD can be programmed to connect one or more of the plurality of I/O blocks, one or more of the plurality of high voltage power transistors via the programmable fabric. Each of the plurality of high voltage power transistors includes a drain pad and a source pad that are exposed via external pins of the PLD.

12 Claims, 18 Drawing Sheets

(56) References Cited

U.S. PATENT DOCUMENTS

| | | | | |
|---|---|---|---|---|
| 2008/0094101 A1* | 4/2008 | Balasubramanian | H03K 17/687 | |
| | | | 326/38 | |
| 2009/0169022 A1* | 7/2009 | Kost | ........................ H03F 1/523 | |
| | | | 381/56 | |
| 2015/0381032 A1* | 12/2015 | Li | ............................ H02M 1/36 | |
| | | | 323/271 | |
| 2017/0115717 A1* | 4/2017 | Shankar | ............. H03K 19/1776 | |
| 2017/0115718 A1* | 4/2017 | Shankar | .................... G05F 1/66 | |

OTHER PUBLICATIONS

Sanders, S. R. et al, "Generalized averaging method for power conversion circuits," IEEE Trans. Power Electronics, vol. 6, No. 2, pp. 251-259, Apr. 1991.

Sanders S. R., "Digital Multimode Buck Converter With Loss-Minimizing Synchronous Rectifier Adaptation," IEEE Trans. Power Electron., vol. 21, No. 6, pp. 1588-1599. Nov. 2006.

Nogawa, Masashi, "Hysteretic-Mode Converters Demystified, Part 1," Power Electronics, pp. 1-11. May 2016.

\* cited by examiner

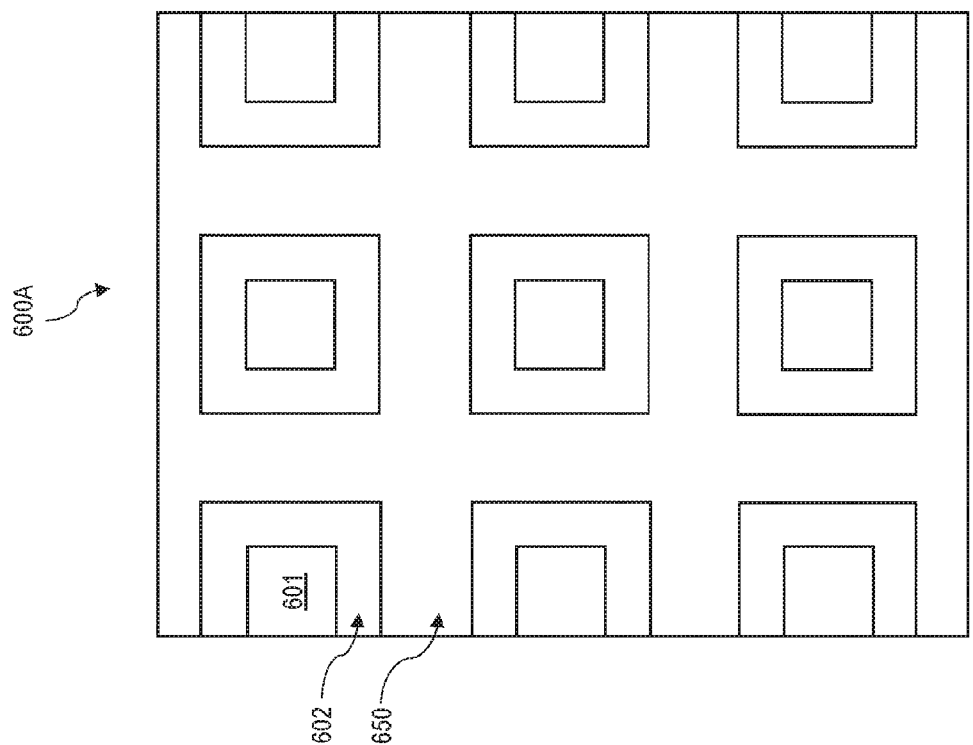

PROGRAMMABLE LOGIC DEVICE WITH INTEGRATED HIGH VOLTAGE POWER FET

CROSS-REFERENCE TO RELATED APPLICATION(S)

This application claims the benefits of and priority to U.S. Provisional Patent Application Ser. Nos. 62/246,751 filed Oct. 27, 2016, 62/247,286 filed Oct. 28, 2016, and 62/256,009 filed Nov. 16, 2015, the disclosures of which are incorporated herein by reference in their entirety. In addition, this application relates to co-pending applications: U.S. patent application Ser. No. 15/336,146, filed on Oct. 27, 2016 and entitled "POWER MANAGEMENT INTEGRATED CIRCUIT INTEGRATING FIELD EFFECT TRANSISTORS AND PROGRAMMABLE FABRIC," and U.S. patent application Ser. No. 15/336,168, filed on Oct. 27, 2016 and entitled "ADAPTIVE ANALOG BLOCKS WITH DIGITAL WRAPPERS INTEGRATED ONTO PROGRAMMABLE FABRIC," the disclosures of which are incorporated herein by reference in their entirety.

TECHNICAL FIELD

The present disclosure relates generally to programmable logic devices (PLDs), more particularly, to a programmable logic device with integrated high voltage power field effect transistor (FET).

BACKGROUND

Programmable logic devices (PLDs) have internal elements and a programmable fabric that can be programmed to connect the internal elements to form a specific circuit or device. Many complex PLDs can add various functional blocks to the programmable fabric. These functional blocks can be a combination of digital and analog blocks such as a serial interface, a voltage reference, a comparator, an analog-to-digital converter, etc. These devices can interface with the external world via input/output (I/O) pins. These I/O pins typically can handle voltages up to 5V and sourcing and sinking currents up to 50 mA.

Typically, PLDs are utilized for non-power applications. When high voltage or currents are required for power applications such as power regulators and power converters, conventional PLDs may be coupled to external high voltage power field effect transistors (FETs) to be able to safely handle high voltages and currents. The coupled external high voltage power FETs are typically housed in a discrete package that is costly and requires more board space. It is not straightforward to merely integrate a conventional PLD with high power FETs that can offer high power handling, optimized performance, and programmability while minimizing the cost and the board space.

SUMMARY

According to one embodiment, a programmable logic device (PLD) includes: a programmable fabric, a plurality of input/output (I/O) blocks, and a plurality of high voltage power field effect transistors (FETs). The PLD can be programmed to connect one or more of the plurality of I/O blocks, one or more of the plurality of high voltage power transistors via the programmable fabric. Each of the plurality of high voltage power transistors includes a drain pad and a source pad that are exposed via external pins of the PLD.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

FIG. 6A illustrates a schematic block diagram of an analog and digital adaptive platform, according to one embodiment.

Figure 1:
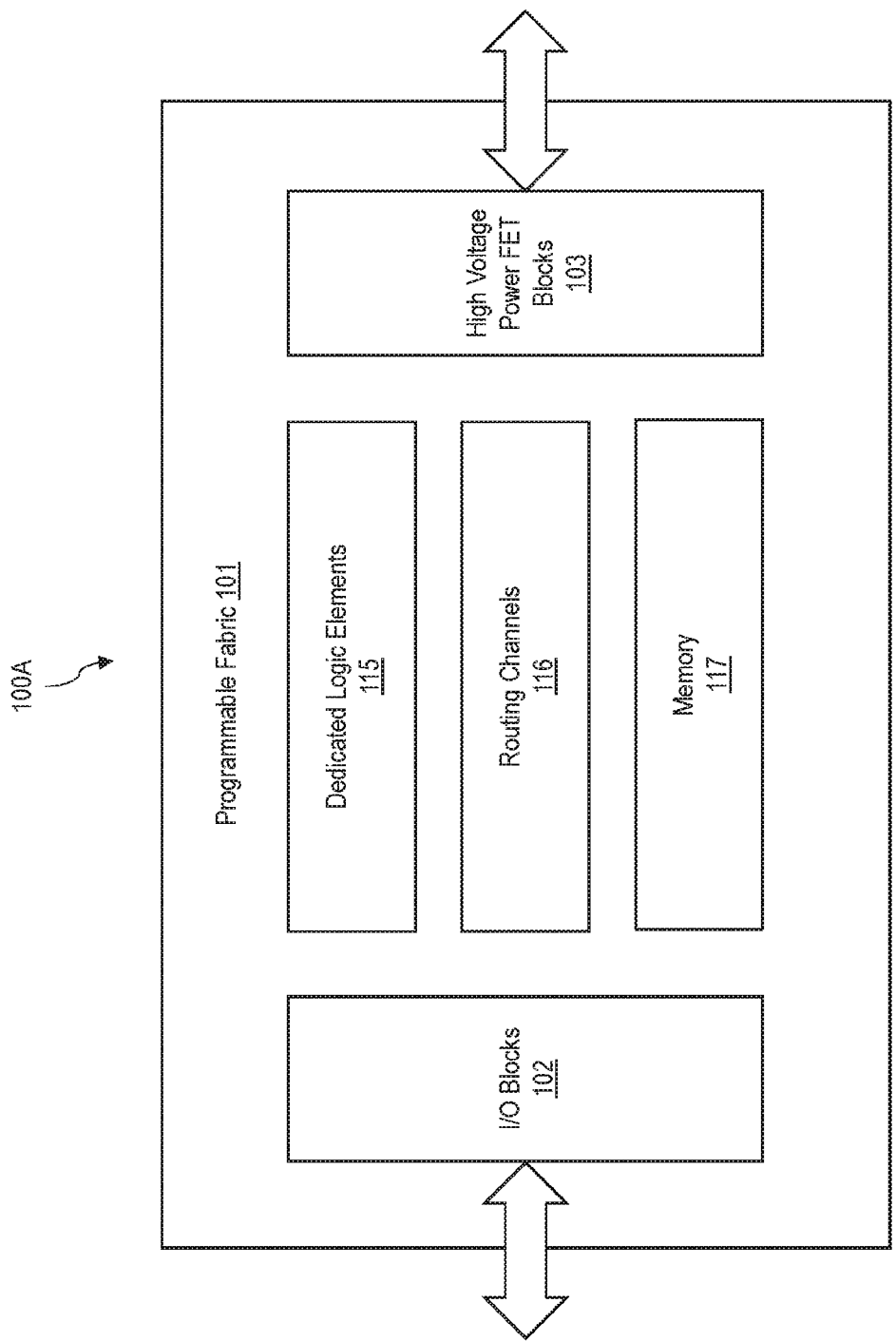
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a programmable logic device with integrated high voltage power field effect transistor (FET). Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a programmable logic devices (PLD) including one or more integrated high power field effect transistors (FETs). Typically, PLDs are used in traditional applications, such as communication, consumer and industrial. Using the integrated high power FETs, the present PLDs can expand the applications into the fields of power applications including, but not limited to, high voltage applications, high current applications, power conversion, industrial controls, power management, automobile, robotics, electric vehicles (EVs), drones, Internet of things (IoT) devices.

The present PLD integrates one or more high voltage power FETs. In addition, the present PLD includes a programmable fabric, one or more input and output (I/O) blocks, one or more functional blocks that are housed in a single package. The single packaged PLD integrating the high voltage power FETs, the programmable fabric, the I/O blocks, and the functional blocks can reduce the board space and the overall cost. The high voltage FETs can handle higher voltage level and source/sink higher current than conventional PLDs. In one embodiment, the source and drain of the high voltage power FETs can be available as external pins. In some embodiments, the source and drain of the high voltage power FETs can be internally connected to each other. The internal connection of the source and drain can be made using the programmable fabric.

The high voltage power FETs can be used as high voltage units in various power applications including, but not limited to, power conversions, switching regulators, battery chargers, etc. The high voltage power FETs integrated in the present PLD can also be used to drive much higher voltage or power externally connected power FETs. The programmable fabric can provide the configurations and the operating conditions of the functional blocks, I/O blocks, the functional blocks, and the high voltage power FETs.

The following describes exemplary embodiments of the present PLD. The examples described herein are intended to provide description and capability of the present PLD without limiting the scope, applications and uses of the present PLD.

FIG. 1 shows a block diagram an example programmable logic device, according to one embodiment. The programmable logic device (PLD) 100A includes a programmable fabric 101, I/O blocks 102 including one or more I/O pins and buffers, and high voltage power FET blocks 103 including one or more high voltage power FETs. In some embodiments, the PLD 100A is referred to as a power management integrated circuit (PMIC). For example, the PMIC can convert one or more low voltage inputs to one or more high power voltage outputs. In another example, the PMIC can convert one or more high voltage inputs to one or more low power voltage outputs. The programmable fabric 101 includes a number of uncommitted programmable logic elements including one or more dedicated logic elements 115 and routing channels 116. The programmable fabric 101 can include a memory 117 including a volatile memory (e.g., a static random-access memory (SRAM)), a non-volatile memory (e.g., a flash memory), or both. The dedicated logic elements 115 can include one or more look up tables, flip flops, and logic gates. The programmable fabric 101 can be programmed to selectively and programmably connect the I/O blocks 102, the high voltage power FET blocks 103, and the dedicated logic elements 115 via the routing channels 116 to form one or more dedicated functions.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The high voltage power FET blocks 103 can be configured and programmed to be a constituent element of a more complex circuit or device. In one embodiment, the high voltage power FET blocks 103 can support voltages ranging from 12V to 80V and current up to 12 A. The voltage and current limits that the high voltage power FET blocks can support 103 as integrated into the PLD 100A may change depending on an intended power application and the process technology used for manufacturing the PLD 100A. According to one embodiment, the high voltage power FET blocks 103 can include both n-channel and p-channel FETs.

According to one embodiment, the source and drain of each the high voltage power FET blocks 103 are connected to external pins to connect to external circuits and/or devices. The presence of one or more high voltage power FETs on the same chip can provide flexible configurations of the PLD 100A by programming the programmable fabric 101. For example, different high voltage power FETs on the same chip can connect to different external power rails or sensor hubs. In another example, the high voltage power FETs can be externally connected in series via the external pins of the source and drain of the high voltage power FETs. The programmable fabric 101 can be programmed to connect the I/O blocks 102, the high voltage power FET blocks 103, and the included logic elements 115 using the programmable routing channels 116 in various configurations to accommodate a wide range of power applications.

Figure 2:
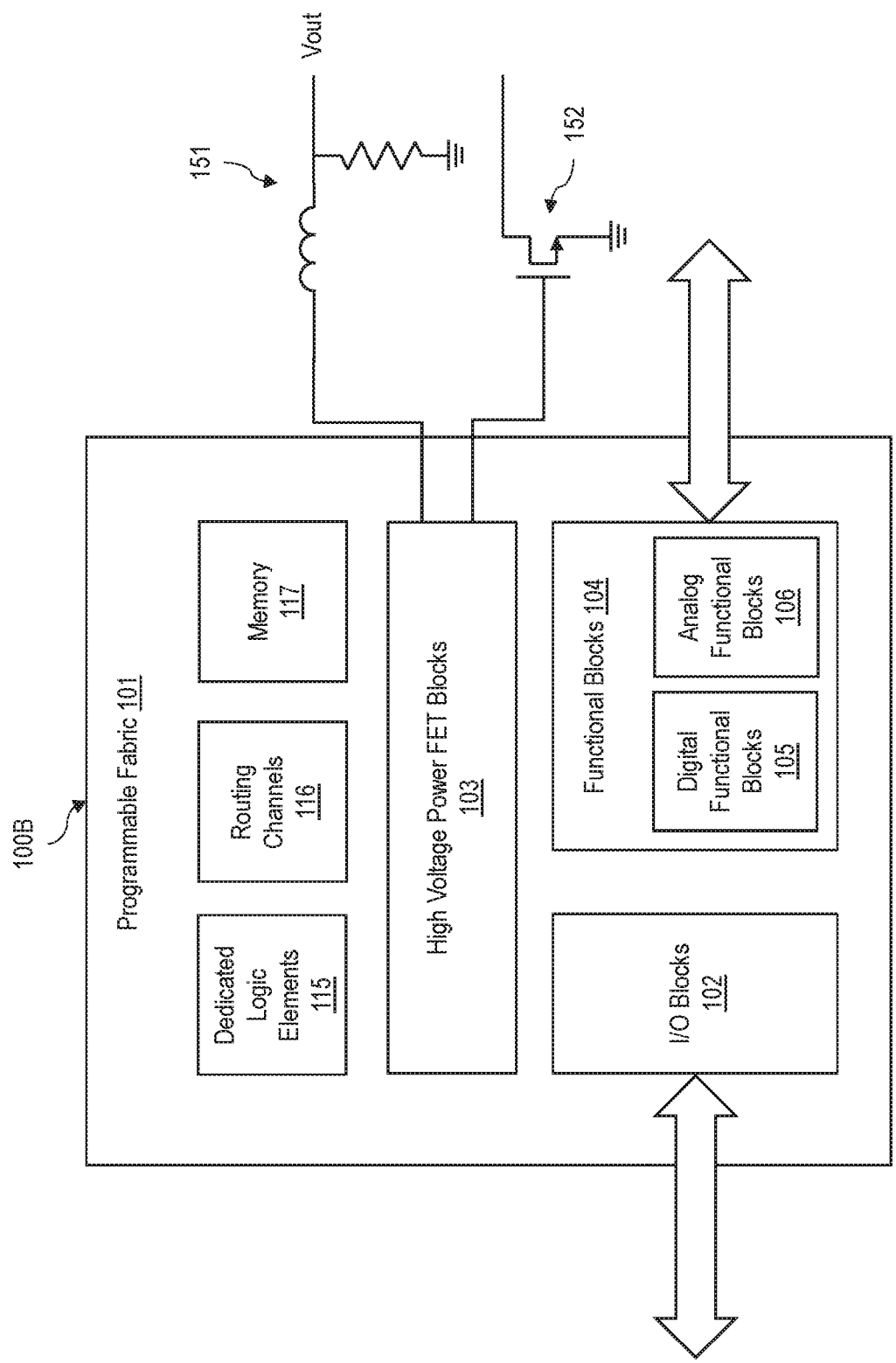
FIG. 2 shows a block diagram an example programmable logic device, according to another embodiment.

FIG. 2 shows a block diagram an example programmable logic device, according to another embodiment. The PLD 100B includes a programmable fabric 101, I/O blocks 102, high voltage power FET blocks 103, and one or more functional blocks 104. In some embodiments, the PLD 100B is referred to as a PMIC. The PMIC can convert one or more low power voltage inputs to one or more high power voltage outputs or convert one or more high voltage inputs to one or more low power voltage outputs. The functional blocks 104 can include one or more of digital functional blocks 105, analog functional blocks 106, or a combination of both. A digital functional block can be any dedicated functions such as a serial interface, a communication protocol, and an application specific control function. An analog functional block can be an analog-to-digital converter, a comparator, a sensor, an amplifier, a voltage reference, a digital-to-analog converter, etc. The parameters of each of these functional blocks 104 such as a gain, a reference voltage, a frequency, a resolution can be configured by the programmable fabric 101. In addition, the programmable fabric 101 can connect different functional elements within the functional blocks 104. Some of the functional blocks 104 such as a reference voltage can be available via external pins. Compared to the programmable fabric 101 of FIG. 1, the programmable fabric 101 can have an advanced architecture, speed, size and routing.

According to one embodiment, the programmable fabric 101 can take a form of a field programmable gate array (FPGA). The FPGA contains an array of programmable logic blocks and reconfigurable interconnects that allow the logical blocks to be programmably wired together. The logic blocks can be configured to perform complex combinational functions, or merely simple logic gates like AND and XOR. The logic blocks may include simple memory elements such as flip-flops or more complete blocks of memory elements.

In the example shown in FIG. 2, the high voltage power FET blocks 103 can provide power supply 151 and drive an external high voltage power FET 152. The voltage limit that the external high voltage power FET 152 can handle is higher than the voltage limit of the high voltage power FET blocks 103 integrated into the PLD 100B. In some embodiments, one or more power supplies 151 and/or one or more external high voltage power FETs 152 can be added if needed. The operating characteristics of the power supply 151 such as voltage levels, turn-on and turn-off sequences, a switching frequency, a voltage ramp rate, tracking between outputs, protection and monitoring can be programmed by programming the connected blocks and elements integrated in the programmable fabric 101. Each of the power supplies 151, if more than one is needed, can be programmed to have different operating characteristics.

The maximum voltage of the high voltage power FET blocks 103 may be limited by the process technology for manufacturing the PLD 100B. In one embodiment, the voltage limit of the high voltage power FET blocks 103 is about 80V. The external discrete power FET 152 can be used if a higher voltage limit than the voltage limit of the high voltage power FET 103 (e.g., 80V) is needed. The operating parameters for the external power FET 152, such as turn-on and turn-off ramp rates, a switching frequency, etc., can also be programmed by the programming the connected blocks and elements integrated in the programmable fabric 101 as well.

Figure 3:
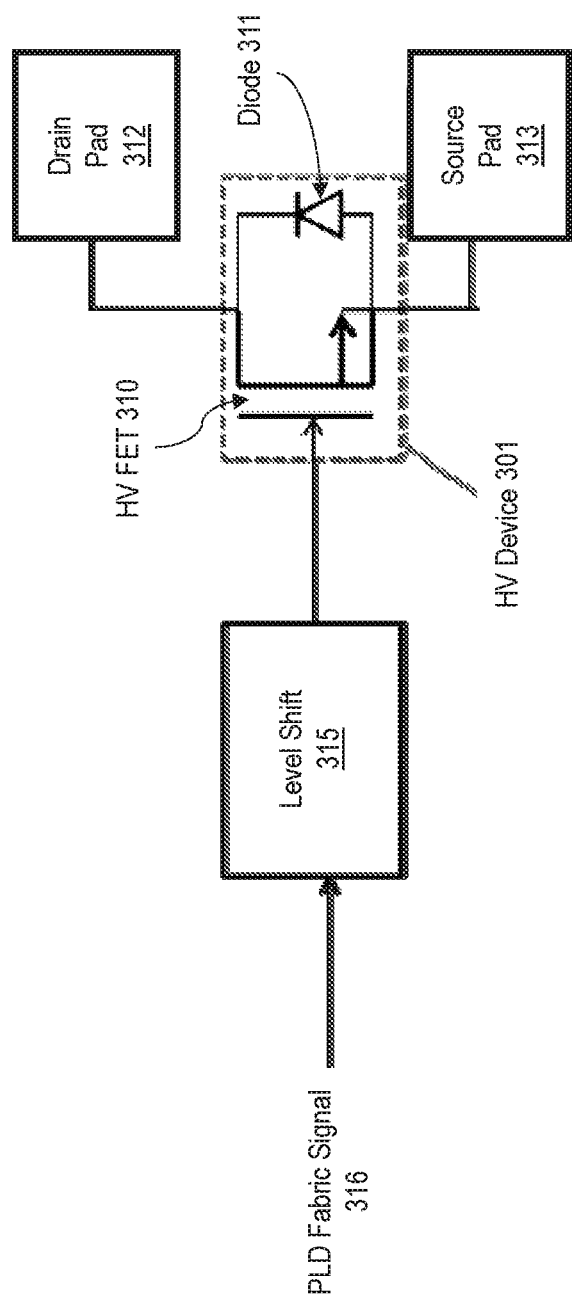
FIG. 3 shows an example of a high voltage device implemented with the present PLD, according to one embodiment.

FIG. 3 shows an example of a high voltage device implemented with the present PLD, according to one embodiment. The drain (D) and the source (S) of a high voltage power FET 310 are available as external pads 312 and 313 that are connected to an internal body diode 311 of the high voltage power FET 310 to form the high voltage device 301. The internal side of the high voltage 310 is coupled to a level shifter 315. The level shifter 315 may be a part of the high voltage power FET block 103 and can convert a low voltage level of a core logic to the high voltage level of the gate of the high voltage power FET 310. A signal 316 from the programmable fabric (e.g., programmable fabric 101 of FIG. 2) can drive the high voltage device 301 via the level shifter 315. The high voltage device characteristics of the high voltage device 301 can be programmed and controlled by the programmable fabric.

Figure 4:
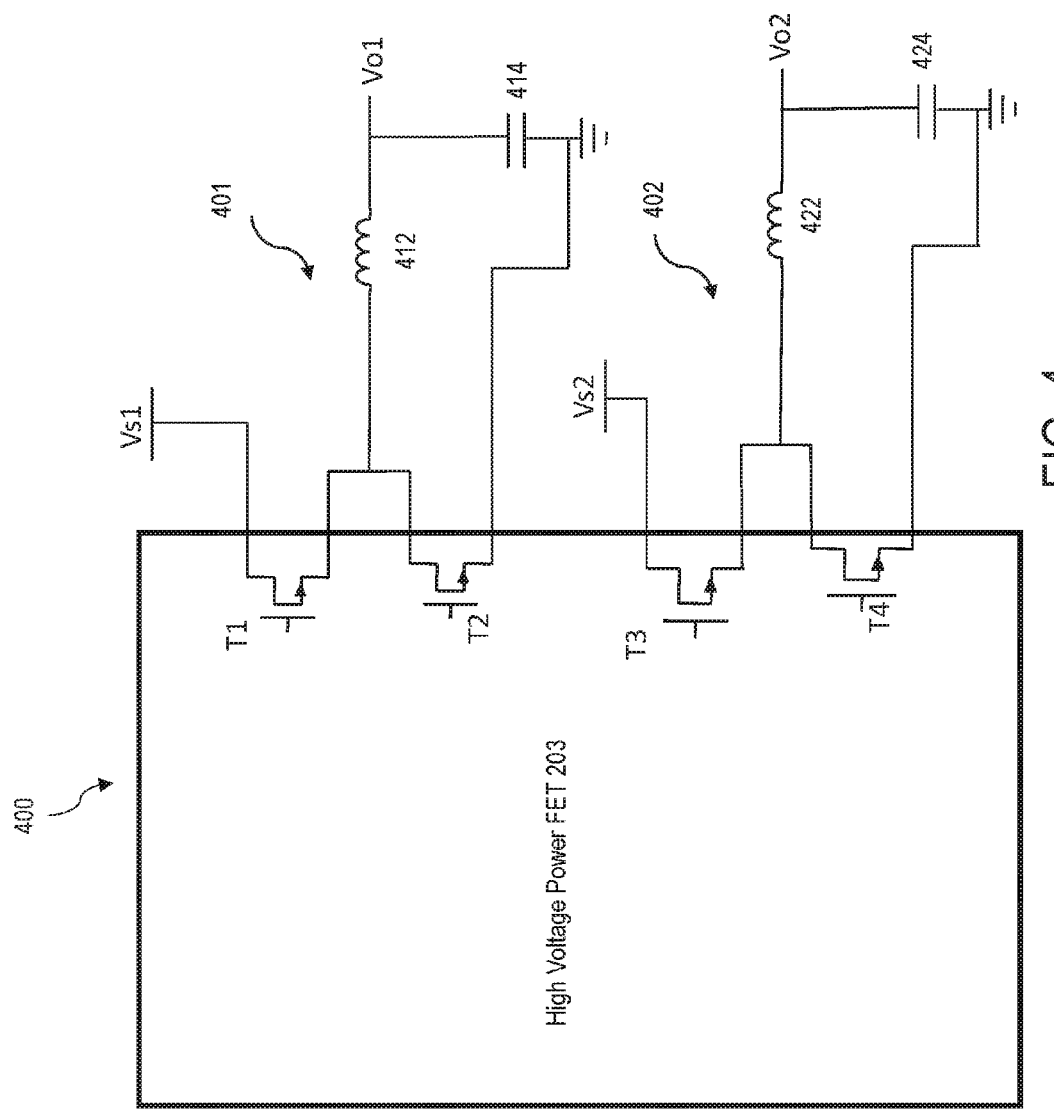
FIG. 4 shows an example dual buck converter, according to one embodiment.

FIG. 4 shows an example dual buck converter, according to one embodiment. For example, the high voltage power FET blocks 103 of FIG. 2 can configured to implement two buck converters 401 and 402. A buck converter is a DC-to-DC power converter that steps down voltage from an input (supply) to an output (load) while stepping up the current.

The buck converter 401 includes two integrated high power FETs, T1 and T2 from the high voltage power FET blocks 103, a filter inductor 412, and an output capacitor 414. In one embodiment, the filter inductor 412 and the output capacitor 414 are externally provided and connected to the drain and source pads of the two integrated high power FETs T1 and T2. T1 is a high side switching device, and T2 is a low side switching device. The buck converter 401 can convert the system voltage Vs1 to a lower voltage Vo1. For example, the system voltage Vs1 can be 12V, 20V, 48V, or higher. The programmable fabric is programmed to control the operating conditions of T1 and T2, such as the turn-on and turn-off sequence, the switching frequency, etc.

In addition, the buck converter 402 includes another two integrated power FETs, T3 and T4 from the high voltage power FET blocks 103, a filter inductor 422 and an output capacitor 424. In one embodiment, the filter inductor 422 and the output capacitor 424 are externally provided and connected to the drain and source pads of the two integrated high power FETs T3 and T4. The buck converter 402 can convert the system voltage Vs2 to a lower voltage Vo2. The system voltages Vs1 and Vs2 can be different or the same, can be from the same power rail, or can be from different power rails, from the same phase or from different phase. Each of the buck converters 401 and 402 are controlled by the programmable fabric. The operating conditions of the buck converters 401 and 401 can be programmed to be identical or different.

The high voltage power FET 103 can be integrated into the PLD 100B by different process technologies with different structures. Examples of the process technology for fabricating discrete high voltage power FETs include, but are not limited to, junction field effect transistor (JFET), metal oxide field effect transistor (MOSFET) and insulated gate bipolar transistor (IGBT). The complementary metal oxide semiconductor (CMOS) process technology is the prevailing process technology for fabricating various integrated circuits such as the PLD 100A of FIG. 1 and the PLD 100B of FIG. 2. The MOSFET technology is more compatible to integrate with the CMOS technology. There are different MOSFET structures for the present high voltage power FETs, such as double diffused MOS (DMOS), V-Groove MOS (VMOS), etc. Among these FET structures, DMOS may be suitable to integrate with the CMOS technology.

Figure 5:
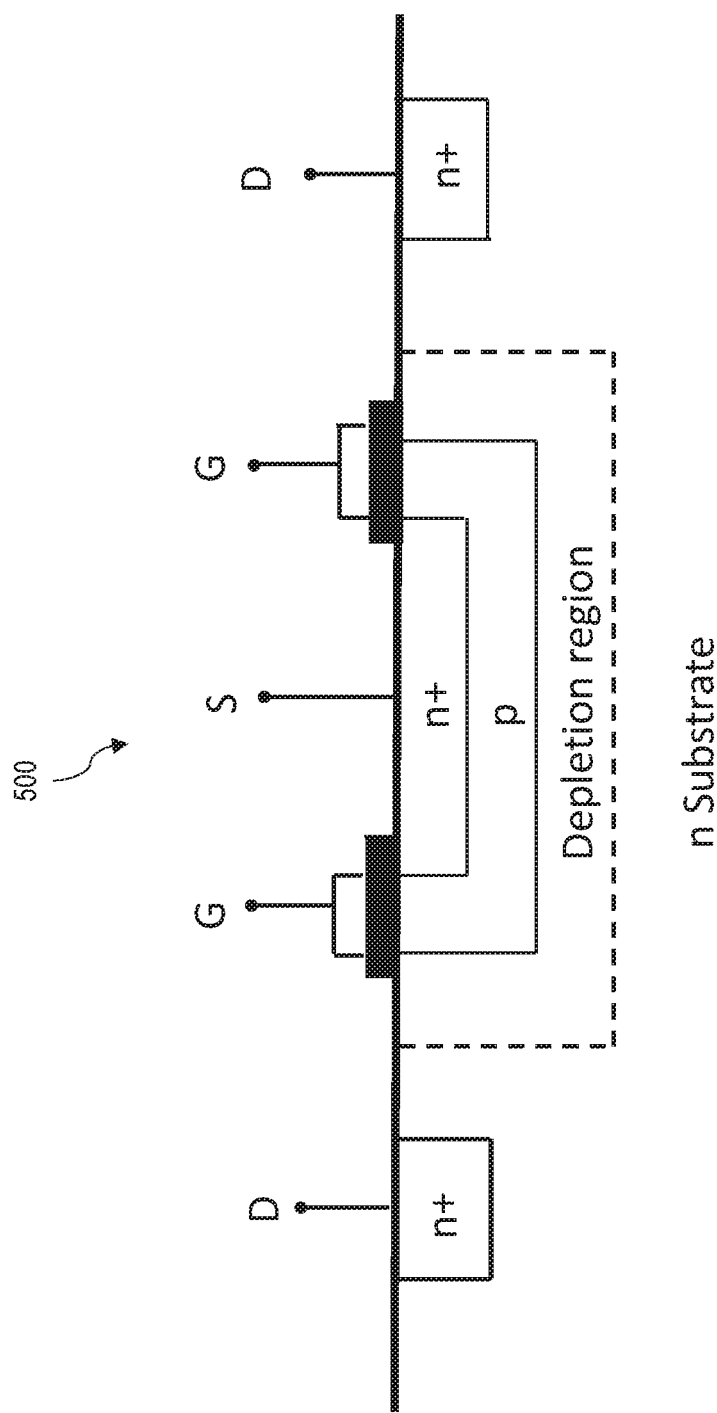
FIG. 5 shows an example of a DMOS high voltage power FET integrated to a CMOS circuit, according to one embodiment.

FIG. 5 shows an example of a DMOS high voltage power FET integrated to a CMOS circuit, according to one embodiment. Integrating the DMOS power FET with the CMOS logic technology on the same chip enables functions that are otherwise not available with discrete implementations. Examples of such functions include, but are not limited to, digital control of linear operation of LDO applications, digital protection such as current measurement for over current protection (OCP), current limit and short circuit protection, over voltage protection (OVP), undervoltage lock out (UVLO), current direction crossover for forced continuous conduction mode (FCCM), digital soft start and soft stop, and digital compensation in switching applications using a proportional-integral-derivative (PID) scheme.

The present disclosure describes analog functional blocks that are adaptive for providing various user-configurable analog functions. The adaptive analog blocks are wrapped with respective digital wrappers on a programmable fabric. The programmable fabric provides a programmable environment to build user-configurable custom analog functions by digitally combining one or more adaptive analog blocks by selectively and programmably combining and connecting digital wrappers that provide interface to the adaptive analog blocks. The adaptive analog blocks are wrapped with the digital fabric to eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with digital wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The digital wrapper of the present adaptive platform can provide a digital PID control to various analog actuators including, but not limited to, DC motors, servo motors, stepper motors, motion control, breakers, fan controllers.

FIG. 6A illustrates a schematic block diagram of an analog and digital adaptive platform, according to one embodiment. The analog and digital adaptive platform 600A includes a plurality of analog and digital adaptive blocks 601 interconnected with digital wrappers 602 on a programmable fabric 650. Each of the adaptive blocks 601 arranged on the programmable fabric 650 is user-configurable and programmable by the coupled digital wrapper 602 to provide a user-configurable function for a target application or one or more circuit components of a target application.

A digital wrapper 602 provides an interface circuitry required for the coupled adaptive block 601 to interconnect with another adaptive block, an I/O block (e.g., I/O block 102 of FIG. 2), and a high voltage power FET block (e.g., high voltage power FET block 103 of FIG. 2) via the programmable fabric 650. According to one embodiment, the analog and digital adaptive platform 600A includes a predetermined number of adaptive blocks 601. Each of the adaptive blocks 601 can be one of, but is not limited to, an analog-to-digital converter (ADC) block, a comparator block, a memory block, a pulse-width modulation (PWM)

block, a voltage reference block, and a timer block. In conjunction with one or more high voltage power FET blocks (e.g., the high voltage power FET blocks 103 of FIG. 2) and programmable analog and digital input/output (I/O) blocks (e.g., the I/O blocks 102), these adaptive blocks 601 can be programmed to configured to build a variety of analog circuitry for various applications via the programmable fabric 650.

According to one embodiment, each of the adaptive blocks 601 or a combination of multiple adaptive blocks 601 is programmed over the programmable fabric 650 to build a variety of analog circuitry for various power applications. Examples of such power applications include, but are not limited to switching converters, linear regulators, load switches, sensors, battery chargers and external switching controllers. According to other embodiments, each of the adaptive blocks 601 or a combination of multiple adaptive blocks 601 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 601, the digital wrappers 602 of the analog and digital adaptive platform 600A can provide a digital proportional-integral-derivative (PID) control to various analog actuators including, but not limited to, a DC motor, a servo motor, a stepper motor, a motion control, breakers, and a fan controller.

Figure 6B:
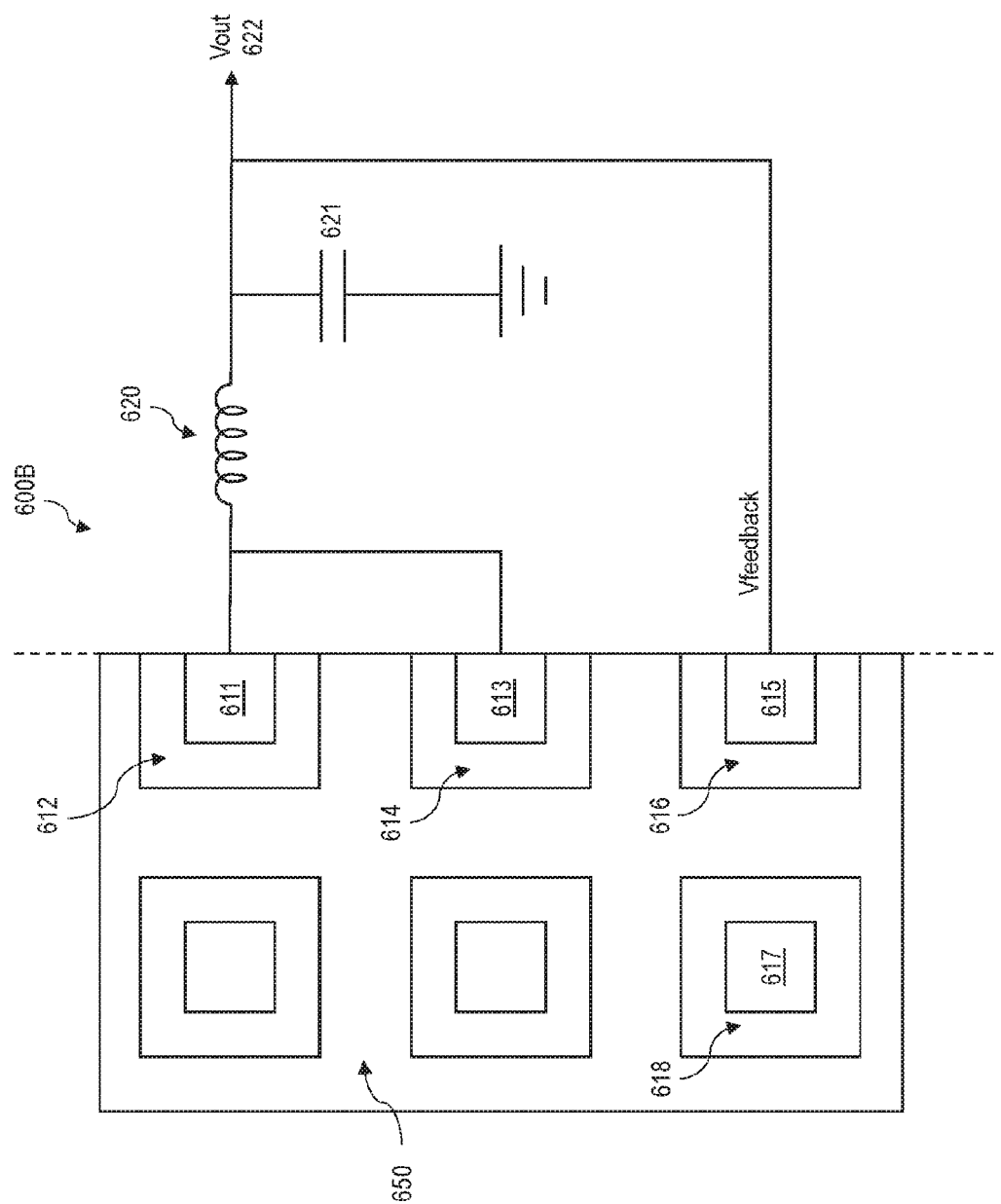
FIG. 6B illustrates an example of the analog and digital adaptive platform of FIG. 6A configured as a hysteretic mode buck switching converter, according to one embodiment.

FIG. 6B illustrates an example of the analog and digital adaptive platform of FIG. 6A configured as a hysteretic mode buck switching converter, according to one embodiment. The hysteretic mode buck switching converter 600B may also be referred to as a bang-bang buck switching converter. The hysteretic mode buck switching converter 600B is a DC-to-DC step-down power converter that converts an input voltage to an output voltage that is lower than the input voltage. The output current may be stepped up while the input voltage is stepped down. The hysteretic mode buck switching converter 600B can provide an efficient power conversion compared to a linear regulator that lowers the input voltage by dissipating power as heat without stepping up the output current.

The analog and digital adaptive platform 600B can be an example of the analog and digital adaptive platform 600A shown in FIG. 6A. For example, the adaptive blocks 611, 613, 615 and 617 are instances of the adaptive blocks 601 of FIG. 6A, the digital wrappers 612, 614, 616, and 618 are instances of the digital wrapper 602 of FIG. 6A. Each of the adaptive blocks 611, 613, 615 and 617 can be one of a comparator block, a memory block, a PWM block, a voltage reference block, and a timer block.

In the present example, the adaptive block 615 is a comparator block. The adaptive blocks 611 and 613 drive a filter including an inductor 620 and a capacitor 621 in a synchronous mode. The feedback voltage, $V_{feedback}$, of the filter output 622 (e.g., 1.0V, 4 A) is connected to the comparator block 615. Various internal connections and routing channels are configured to interconnect the adaptive blocks 611, 613, 615 and 617. For example, the adaptive block 617 and the adaptive block 615 are interconnected using the digital wrapper 618 that provides a digital interface to the adaptive block 617, and the digital wrapper 616 that provides a digital interface to the adaptive block 615 via the programmable fabric 650. In a similar fashion, the adaptive block 617 and the adaptive block 613 can be interconnected with the digital wrapper 618 and digital wrapper 614, and the adaptive block 617 and the adaptive block 611 are interconnected with the digital wrapper 618 and the digital wrapper 612 via the programmable fabric 650. In this example, the adaptive blocks 611, 613, 615 and 617 are configured as a hysteretic mode buck switching converter to provide a stepped-down voltage output.

Figure 7A:
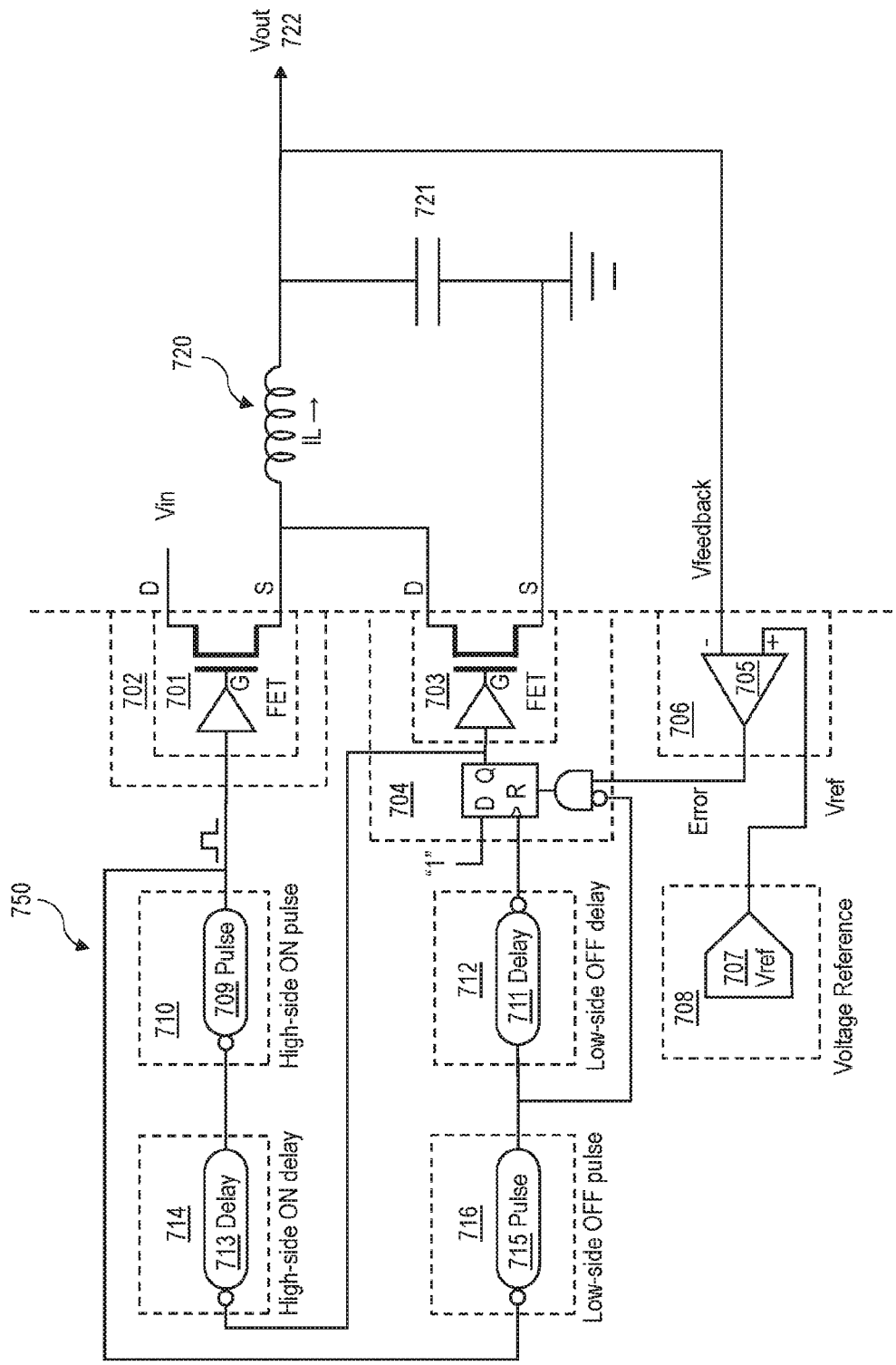
FIG. 7A illustrates a schematic diagram of an example hysteretic mode buck switching converter, according to one embodiment.
Figure 7B:
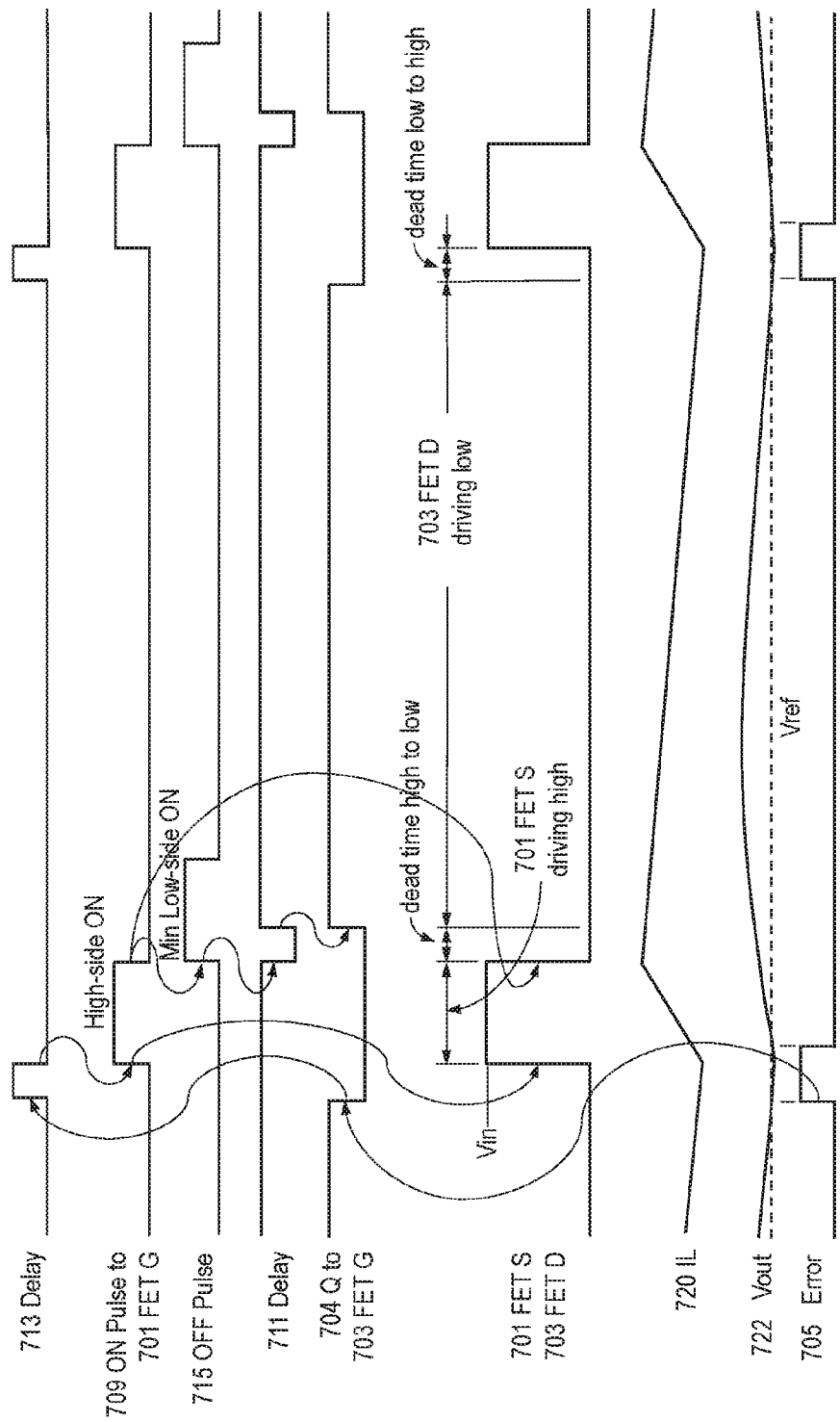
FIG. 7B illustrates a timing diagram of the example hysteretic mode buck switching converter of FIG. 7A.

FIG. 7A illustrates a schematic diagram of an example hysteretic mode buck switching converter, according to one embodiment. The hysteretic mode buck switching converter shown in FIG. 7A may also be referred to as a bang-bang buck switching converter. FIG. 7B is a signal diagram for the example hysteretic mode buck switching converter of FIG. 7A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 701, 703, 705, 707, 709, 711, 713, and 715, each of which wrapped with respective digital wrappers 702, 704, 706, 708, 710, 712, 714, and 716. Among the adaptive blocks, the adaptive blocks 701 and 703 are high voltage power FET blocks, the adaptive block 705 is a comparator block, the adaptive blocks 709, 711, 713, and 715 are timer blocks, and the adaptive block 707 is a voltage reference block.

Each of the high voltage power FET blocks (e.g., the high voltage power FET blocks 701 and 703) can be programmed for a specific target application and configured as, for example, but not limited to, a switcher, a linear operator, a current sense, and a protector. In the present example, the high voltage power FET blocks 701 and 703 are programmed and configured as a switcher driving a high current output.

The comparator block 705 is configured to compare a voltage difference between an internal reference from the voltage reference block 707 and an external analog I/O signal $V_{feedback}$.

A timer block (e.g., the timer blocks 709, 711, 713, and 715) can be programmed to generate nanosecond, microsecond, and millisecond delays or pulses. The timer block can provide a precision dead-time control for improved efficiency. In the present example, the timer blocks 709 and 715 provide a constant-on-time pulse, and the timer blocks 711, and 713 are timers with a fixed delay specified by configuration.

A voltage reference block (e.g., the voltage reference block 707) can be used to provide a digitally-adjustable precision voltage reference. The voltage reference block can also provide protection for over current (OCP), over voltage (OVP), over temperature protection (OTP), under voltage-lockout (UVLO) references. In the present example, the voltage reference block 707 provides a fixed voltage reference specified at configuration, which provides the desired output voltage, $V_{ref}$.

The high voltage power FET blocks 701 and 703 can drive the filter inductor 720 and the capacitor 721 in a synchronous mode as described in the signal diagram of FIG. 7B. The feedback voltage, $V_{feedback}$, from the filter output 722, $V_{out}$, is externally connected to the comparator block 705. The comparator block 705 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 707 interconnected with the digital wrapper 708 and the digital wrapper 706 via the programmable fabric 750.

When the error signal 705 is true, the D-type flip-flop in the digital wrapper 704 is reset to turn off the high voltage power FET block 703 and start the delay timer block 713. After this delay, the timer block 709 generates a constant-on-time pulse to turn on the high voltage power FET block 701 through the connection made with digital wrapper 710 and digital wrapper 702 via the programmable fabric 750. The high voltage power FET block 701 drives the inductor 720 to charge the output capacitor 721. When the pulse is completed, the falling edge of the pulse starts the minimum low-side ON pulse of the timer block 715 and sets the D-type flip-flop in the digital wrapper 704 after a fixed delay determined by the timer block 711 as shown in the signal diagram of FIG. 7B through the connection established with the digital wrapper 712 and the digital wrapper 704, and the connection established with the digital wrapper 710 and the digital wrapper 712 via the programmable fabric 750. The fixed delay is specified to ensure that the high-drive voltage power FET block 701 is off, dead time, before the low-drive high voltage power FET block 703 is turned on, preventing momentary shoot-through current as shown in the signal diagram of FIG. 7B. The D-type flip-flop in the digital wrapper 704 turns on the high voltage power FET block 703 driving the inductor 720 to discharge the output capacitor 721.

The next cycle begins by first tuning off the low-side high voltage power FET block 703 with a fixed delay reset pulse from the timer block 713 where the fixed delay is specified to ensure that the low-drive high voltage power FET block 703 is off, dead time, before the high-drive voltage power FET block 701 is turned on by the timer block 709, again, preventing momentary shoot-through current as shown in the signal diagram of FIG. 7B.

Figure 8:
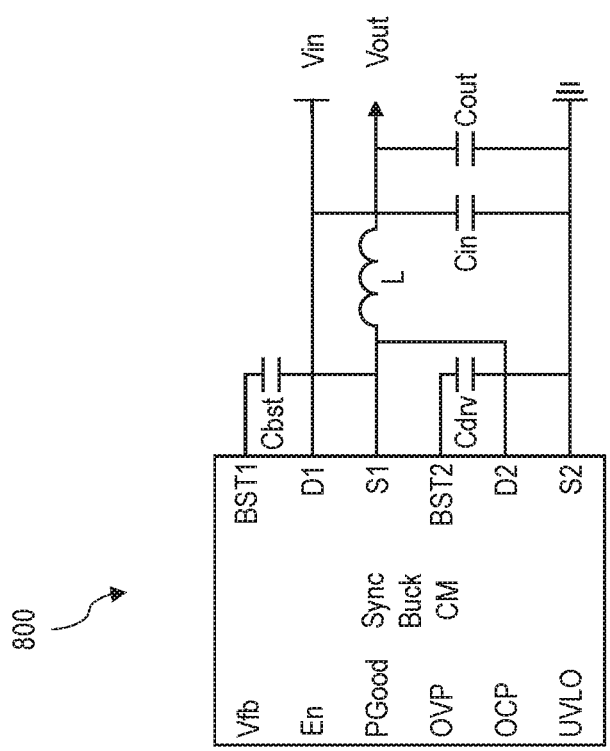
FIG. 8 is a schematic diagram of an example analog and digital adaptive platform configured as a current mode buck switching converter, according to one embodiment.

FIG. 8 is a schematic diagram of an example analog and digital adaptive platform configured as a current mode (CM) buck switching converter, according to one embodiment. The current mode is enabled with a high voltage power FET block configured as a current sense. The current mode buck switching converter PLD 800 includes a programmable fabric, a plurality of I/O blocks, and a plurality of integrated analog and digital functional blocks. In one embodiment, the current mode buck switching converter PLD 800 includes two high voltage power FET blocks, one ADC block, one memory block, one or more voltage reference blocks, and three or more timer blocks. The I/O pins of the current mode buck switching converter PLD 800 include:

Vfb (analog input): voltage feedback from the $V_{out}$ signal,
En (digital input): enables the current mode buck switching converter PLD 800 to turn on,
PGood (digital output): indicates power is good,
OVP (digital output): indicates over voltage protection,
OCP (digital output): indicates over current protection,
UVLO (digital output): indicates under voltage lock out,
BST1 (analog input): the first bootstrap voltage,
D1 (analog): the first FET drain pad,
S1 (analog): the first FET source pad,
BST2 (analog input): the second bootstrap voltage,
D2 (analog): the second FET drain pad, and
S2 (analog): the second FET source pad.

Figure 9:
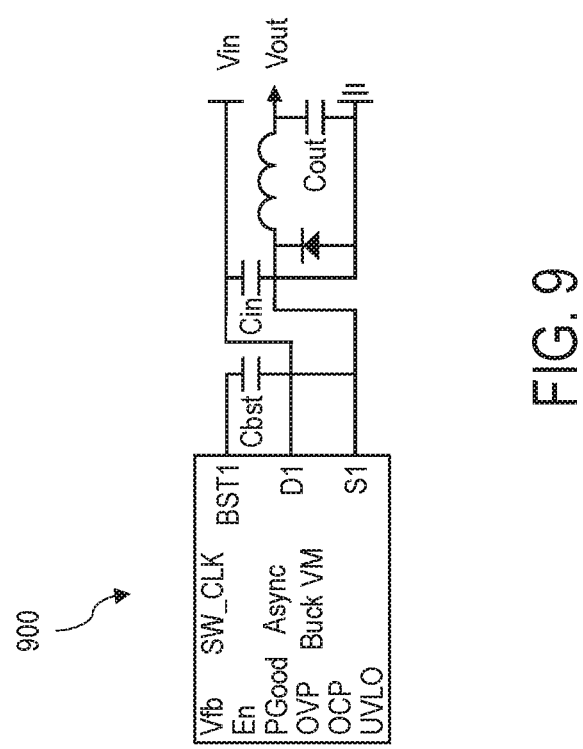
FIG. 9 is a schematic diagram of an example analog and digital adaptive platform configured as an asynchronous buck voltage mode switching converter, according to one embodiment.

FIG. 9 is a schematic diagram of an example analog and digital adaptive platform configured as an asynchronous buck voltage mode switching converter, according to one embodiment. The asynchronous buck voltage mode switching converter PLD 900 includes a programmable fabric, a plurality of I/O blocks, and a plurality of integrated analog and digital functional blocks. In one embodiment, the voltage mode switching converter PLD 900 includes one high voltage power FET block, one ADC block, one memory block, one or more voltage reference blocks, and three or more timer blocks. The I/O pins of the asynchronous buck voltage mode switching converter PLD 900 include:

Vfb (analog input): voltage feedback from the $V_{out}$ signal,
En (digital input): enables the voltage mode buck switching converter PLD 900 to turn on,
PGood (digital output): indicates power is good,
OVP (digital output): indicates over voltage protection,
OCP (digital output): indicates over current protection,
UVLO (digital output): indicates under voltage lock out,
BST1 (analog input): a bootstrap voltage,
D1 (analog): a FET drain pad, and
S1 (analog): a FET source pad.

Figure 10:
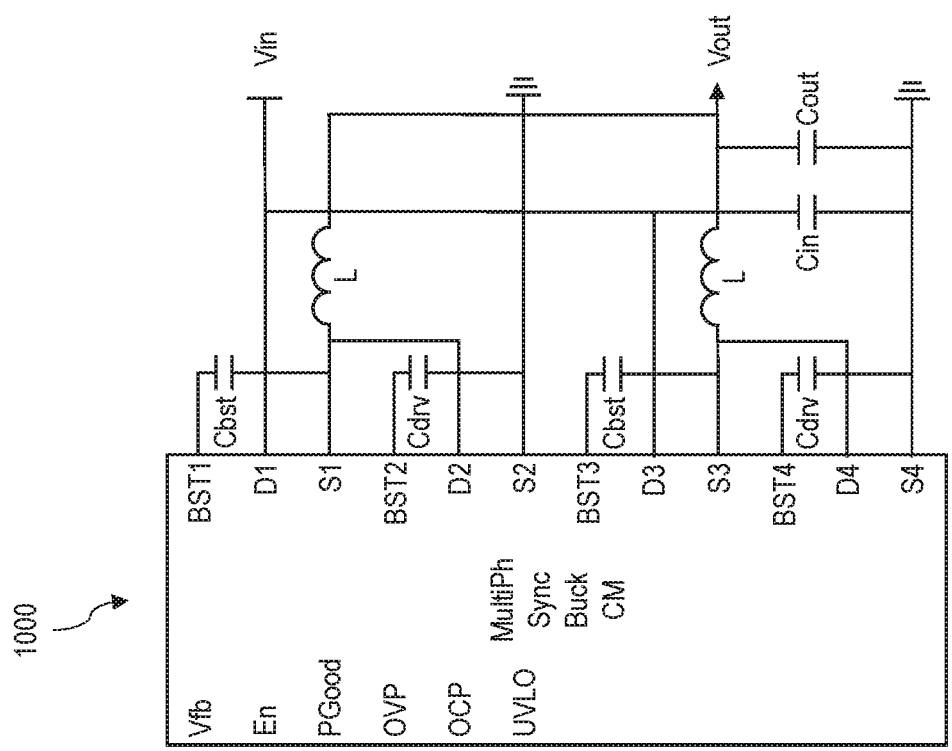
FIG. 10 is a schematic diagram of an example analog and digital adaptive platform configured as a multiphase synchronous buck current mode switching converter, according to one embodiment.

FIG. 10 is a schematic diagram of an example analog and digital adaptive platform configured as a multiphase synchronous buck current mode switching converter, according to one embodiment. The current mode is enabled with a high voltage power FET block configured as a current sense. The multiphase synchronous buck current mode switching converter PLD 1000 includes a programmable fabric, a plurality of I/O blocks, and a plurality of integrated analog and digital functional blocks. In one embodiment, the multiphase synchronous buck current mode switching converter PLD 1000 includes four high voltage power FET blocks, one ADC block, one memory block, one or more voltage reference blocks, and three or more timer blocks. The I/O pins of the multiphase synchronous buck current mode switching converter PLD 1000 include:

Vfb (analog input): voltage feedback from the $V_{out}$ signal,
En (digital input): enables the buck switching converter PLD 1000 to turn on,
PGood (digital output): indicates power is good,
OVP (digital output): indicates over voltage protection,
OCP (digital output): indicates over current protection,
UVLO (digital output): indicates under voltage lock out,
BST1 (analog input): the first bootstrap voltage,
D1 (analog): the first FET drain pad,
S1 (analog): the first FET source pad,
BST2 (analog input): the second bootstrap voltage,
D2 (analog): the second FET drain pad,
S2 (analog): the second FET source pad,
BST3 (analog input): the third bootstrap voltage,
D3 (analog): the third FET drain,
S3 (analog): the third FET source,
BST4 (analog input): the fourth bootstrap voltage,
D4 (analog): the fourth FET drain pad, and
S4 (analog): the fourth FET source.

Figure 11:
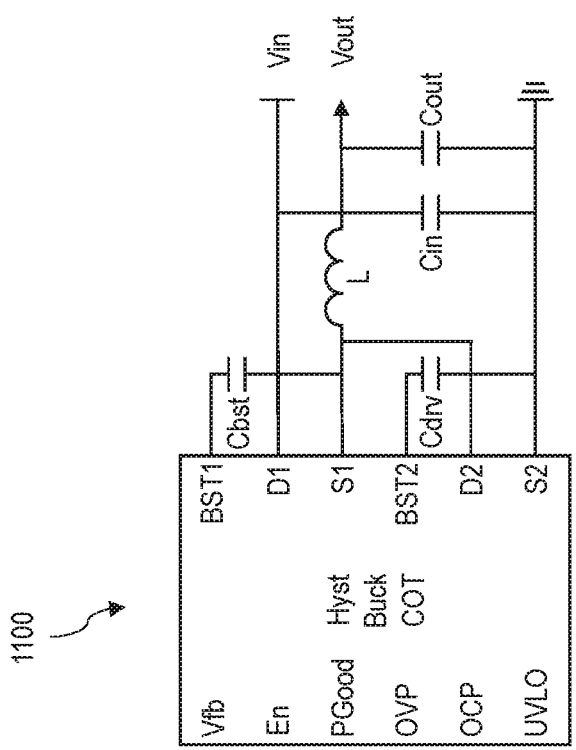
FIG. 11 is a schematic diagram of an example analog and digital adaptive platform configured as a hysteretic constant-on-time buck switching converter, according to one embodiment.

FIG. 11 is a schematic diagram of an example analog and digital adaptive platform configured as a hysteretic constant-on-time (COT) buck switching converter, according to one embodiment. The hysteretic constant-on-time buck switching converter PLD 1100 includes a programmable fabric, a plurality of I/O blocks, and a plurality of integrated analog and digital functional blocks. In one embodiment, the hysteretic buck constant-on-time switching converter 1100 includes two high voltage power FET blocks, one ADC block, one memory block, one or more voltage reference blocks, and three or more timer blocks. The I/O pins of the hysteretic constant-on-time buck switching converter PLD 1100 include:

Vfb (analog input): voltage feedback from the $V_{out}$ signal,
En (digital input): enables the hysteretic buck constant-on-time switching converter 1100 to turn on,
PGood (digital output): indicates power is good,
OVP (digital output): indicates over voltage protection,
OCP (digital output): indicates over current protection,
UVLO (digital output): indicates under voltage lock out,
BST1 (analog input): the first bootstrap voltage,
D1 (analog): the first FET drain pad,
S1 (analog): the first FET source pad,
BST2 (analog input): the second bootstrap voltage,
D2 (analog): the second FET drain pad, and
S2 (analog): the second FET source pad.

Figure 12:
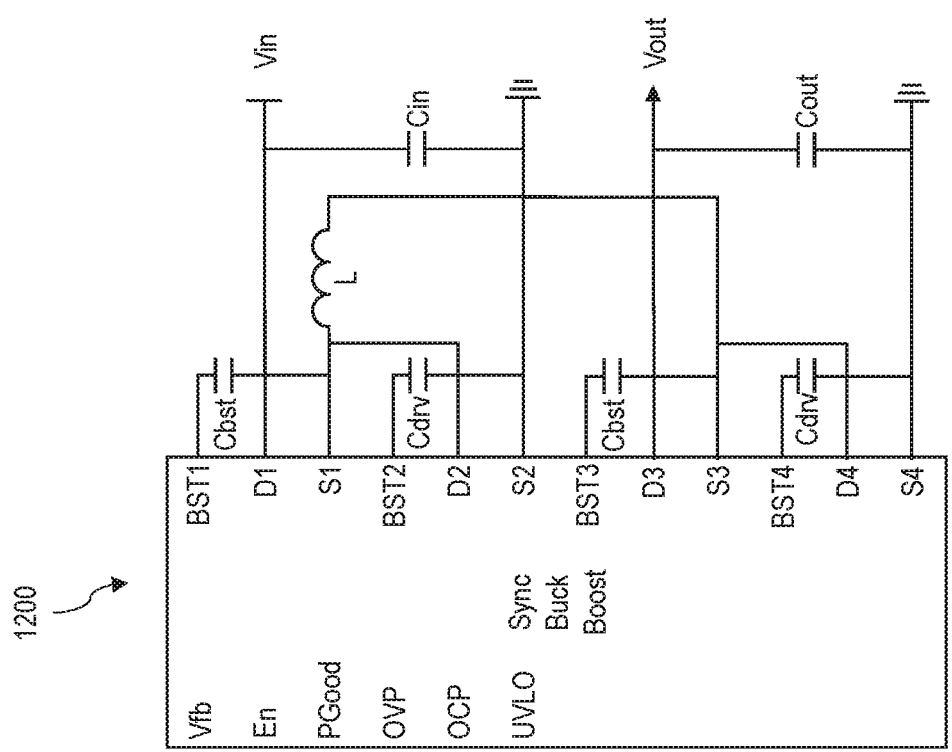
FIG. 12 is a schematic diagram of an example analog and digital adaptive platform configured as a synchronous buck-boost switching converter, according to one embodiment.

FIG. 12 is a schematic diagram of an example analog and digital adaptive platform configured as a synchronous buck-boost switching converter, according to one embodiment. The synchronous buck-boost switching converter PLD 1200 includes a programmable fabric, a plurality of I/O blocks, and a plurality of integrated analog and digital functional blocks. In one embodiment, the synchronous buck-boost switching converter PLD 1200 includes four high voltage power FET blocks, one ADC block, one memory block, one or more voltage reference blocks, and three or more timer blocks. The I/O pins of the synchronous buck-boost switching converter PLD 1200 include:

Vfb (analog input): voltage feedback from the $V_{out}$ signal,
En (digital input): enables the synchronous buck-boost switching converter PLD 1200 to turn on,
PGood (digital output): indicates power is good,
OVP (digital output): indicates over voltage protection,
OCP (digital output): indicates over current protection,
UVLO (digital output): indicates under voltage lock out,
BST1 (analog input): the first bootstrap voltage,
D1 (analog): the first FET drain pad,
S1 (analog): the first FET source pad,
BST2 (analog input): the second bootstrap voltage,
D2 (analog): the second FET drain pad,
S2 (analog): the second FET source pad,
BST3 (analog input): the third bootstrap voltage,
D3 (analog): the third FET drain pad,
S3 (analog): the third FET source pad,
BST4 (analog input): the fourth bootstrap voltage,
D4 (analog): the fourth FET drain pad, and
S4 (analog): the fourth FET source pad.

Figure 13:
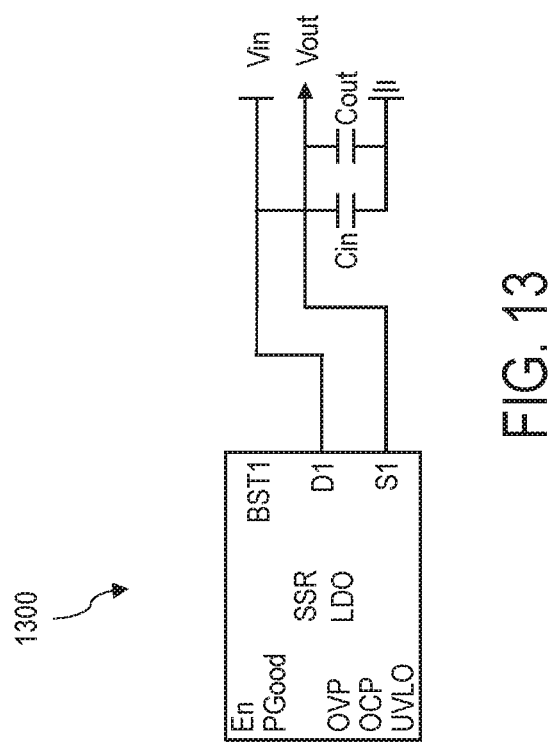
FIG. 13 is a schematic diagram of an example analog and digital adaptive platform configured as a source-side regulator (SSR) low drop out (LDO) linear regulator, according to one embodiment.

FIG. 13 is a schematic diagram of an example analog and digital adaptive platform configured as a source-side SSR low drop out (LDO) linear regulator, according to one embodiment. The source-side SSR LDO linear regulator PLD 1300 includes a programmable fabric, a plurality of I/O blocks, and a plurality of integrated analog and digital functional blocks. In one embodiment, the source side SSR LDO linear regulator PLD 1300 includes one high voltage power FET block, one or more voltage reference blocks, and three or more timer blocks. The I/O pins of the source-side SSR low drop out (LDO) linear regulator PLD 1300 include:

En (digital input): enables the source-side SSR LDO linear regulator PLD 1300 to turn on,
PGood (digital output): indicates power is good,
OVP (digital output): indicates over voltage protection,
OCP (digital output): indicates over current protection,
UVLO (digital output): indicates under voltage lock out,
BST1 (analog input): a bootstrap voltage,
D1 (analog): a FET drain pad,
S1 (analog): a FET source pad.

Figure 14:
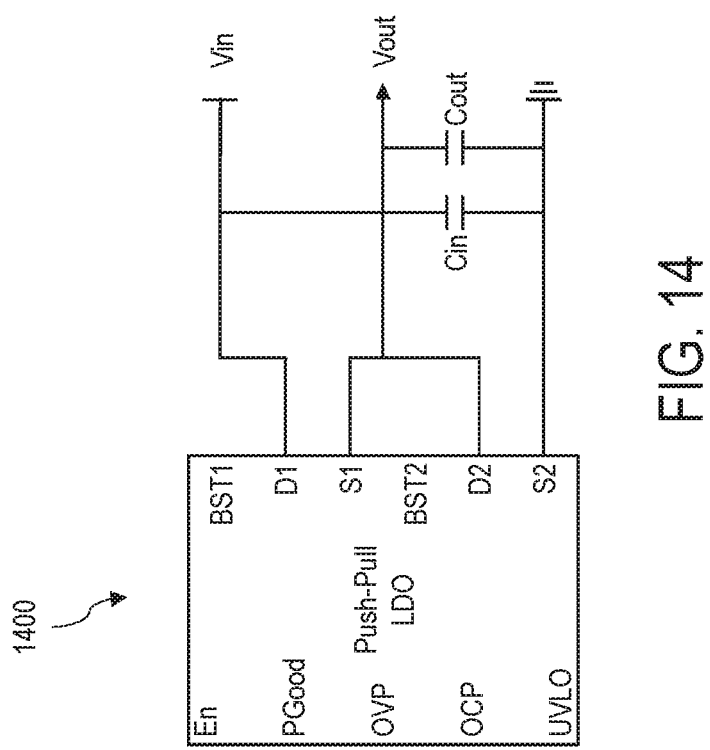
FIG. 14 is a schematic diagram of an example analog and digital adaptive platform configured as a push-pull low drop out (LDO) linear regulator, according to one embodiment.

FIG. 14 is a schematic diagram of an example analog and digital adaptive platform configured as a push-pull linear regulator, according to one embodiment. The push-pull LDO linear regulator converter PLD 1400 includes a programmable fabric, a plurality of I/O blocks, and a plurality of integrated analog and digital functional blocks. In one embodiment, the push-pull LDO linear regulator converter PLD 1400 includes two high voltage power FET blocks, one or more voltage reference blocks, and three or more timer blocks. The I/O pins of the push-pull LDO linear regulator converter PLD 1400 include:

En (digital input): enables the push-pull LDO linear regulator converter PLD 1400 to turn on,
PGood (digital output): indicates power is good,
OVP (digital output): indicates over voltage protection,
OCP (digital output): indicates over current protection,
UVLO (digital output): indicates under voltage lock out,
BST1 (analog input): the first bootstrap voltage,
D1 (analog): the first FET drain pad,
S1 (analog): the first FET source pad,
BST2 (analog input): the second bootstrap voltage,
D2 (analog): the second FET drain pad, and
S2 (analog): the second FET source pad.

Figure 15:
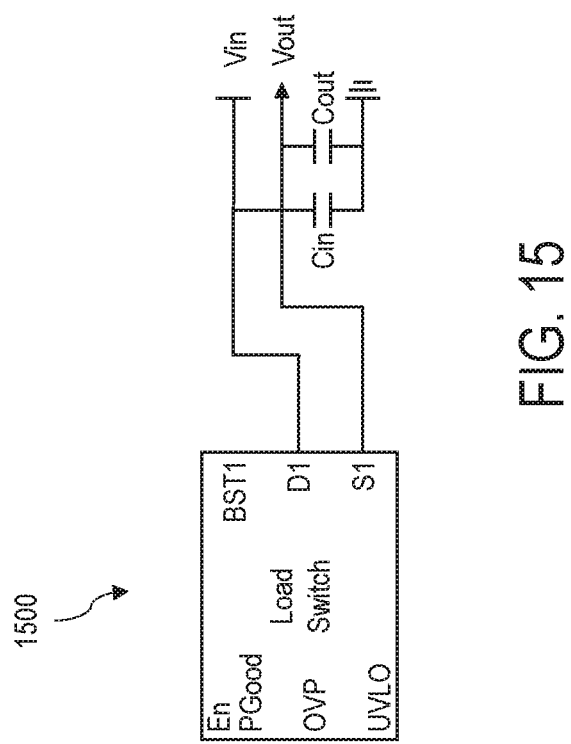
FIG. 15 is a schematic diagram of an example analog and digital adaptive platform configured as a load switch, according to one embodiment.

FIG. 15 is a schematic diagram of an example analog and digital adaptive platform configured as a load switch, according to one embodiment. The load switch PLD 1500 includes a programmable fabric, a plurality of I/O blocks, and a plurality of integrated analog and digital functional blocks. In one embodiment, the load switch PLD 1500 includes one high voltage power FET block, one or more voltage reference blocks and three or more timer blocks. The I/O pins of the load switch PLD 1500 include:

En (digital input): enables the load switch PLD 1500 to turn on,
PGood (digital output): indicates power is good,
OVP (digital output): indicates over voltage protection,
OCP (digital output): indicates over current protection,
UVLO (digital output): indicates under voltage lock out,
BST1 (analog input): a bootstrap voltage,
D1 (analog): a FET drain pad, and
S1 (analog): a FET source pad.

Figure 16:
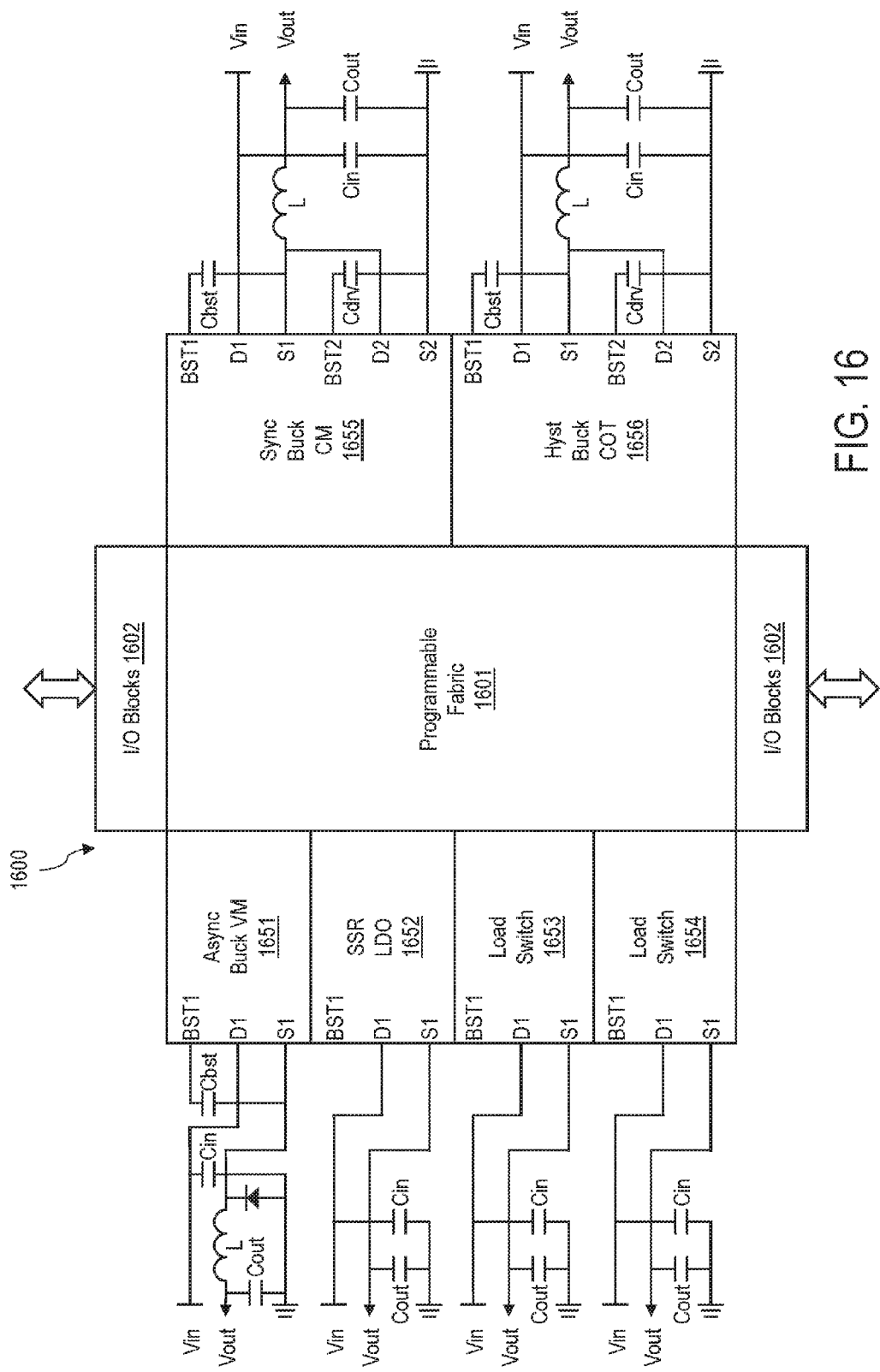
FIG. 16 is a schematic diagram of an example analog and digital adaptive platform, according to one embodiment.

FIG. 16 is a schematic diagram of an example analog and digital adaptive platform, according to one embodiment. In this embodiment, the analog and digital adaptive platform 1600 is configured to have one asynchronous buck voltage mode switching converter 1651, one SSR LDO 1652, two load switches 1653 and 1654, one synchronous buck voltage mode switching converter 1655, and one hysteretic buck switching converter 1656.

When there are sufficient functional blocks and multiple high voltage power FETs integrated within a single programmable logic device, one can implement one or more functions within the same PLD. For example, the devices 900, 1000, and 1200 shown in FIGS. 9, 10, and 12 respectively can be implemented in a single PLD. The combinations and permutation of different functions may be limited by the number of the integrated functional blocks, high voltage FETs and the programmable fabric.

According to one embodiment, a programmable logic device (PLD) includes: a programmable fabric including a plurality of logic elements and a plurality of routing channels; a plurality of input/output (I/O) blocks; and a plurality of high voltage power transistors. The PLD is programmed to connect one or more of the plurality of I/O blocks, one or more of the plurality of high voltage power transistors via the programmable fabric. Each of the plurality of high voltage power transistors includes a drain pad and a source pad that are exposed via external pins of the PLD.

The plurality of logic elements may include one or more of memory blocks including a static random-access memory (SRAM), and a non-volatile memory, look up tables, flip flops, and logic gates.

Each of the plurality of high voltage power transistors may be capable of handling a voltage ranging from 12V to 80V and current up to 12 A.

The drain pad and the source pad may be connected to an external electric element or device.

A first high voltage power transistor of the plurality of high voltage power transistors may be programmed to provide a power supply. Operating characteristics of the power supply may be programmed by the programming the programmable fabric.

The operating characteristics of the power supply may include voltage levels, turn-on and turn-off sequences, a switching frequency, a voltage ramp rate, tracking between outputs, protection and monitoring.

A second high voltage power transistor of the plurality of high voltage power transistors may be programmed to drive an external high voltage power FET.

A first group of the plurality of high voltage power transistors may be coupled to provide a first power switch.

The first power switch may be one of a voltage mode buck switching converter, a current mode buck switching converter, a boost regulator, a buck-boost regulator, a low drop-out (LDO) regulator, a load switch, a mux, a battery charger, an external switching controller, a gate driver, and an integrator.

A second group of the plurality of high voltage power transistors may be coupled to provide a second power switch. The first power switch may be a first buck converter, and the second power switch may be a second buck converter.

The plurality of high voltage power transistors may include a DMOS high voltage power FET integrated to a CMOS circuit.

The PLD may further include a plurality of functional blocks including adaptive blocks.

The adaptive blocks may include one or more of an analog-to-digital converter (ADC) block, a comparator block, a memory block, a pulse-width modulation (PWM) block, a voltage reference block, and a timer block.

The above example embodiments have been described hereinabove to illustrate various embodiments of implementing a system and method for providing a programmable logic device with integrated high voltage power field effect transistor (FET). Various modifications and departures from the disclosed example embodiments will occur to those having ordinary skill in the art. The subject matter that is intended to be within the scope of the invention is set forth in the following claims.

What is claimed is:

1. A programmable logic device (PLD) comprising:
   a programmable fabric including a plurality of logic elements and a plurality of routing channels;
   a plurality of input/output (I/O) blocks; and
   a plurality of high voltage power transistors,
   wherein the PLD is programmed to connect one or more of the plurality of I/O blocks, one or more of the plurality of high voltage power transistors via the programmable fabric,
   wherein each of the plurality of high voltage power transistors includes a drain pad and a source pad that are exposed via external pins of the PLD, and
   wherein a first high voltage power transistor of the plurality of high voltage power transistors is programmed to provide a power supply, and wherein operating characteristics of the power supply is programmed by the programming the programmable fabric.

2. The PLD of claim 1, wherein the plurality of logic elements includes one or more of memory blocks including a static random-access memory (SRAM), and a non-volatile memory, look up tables, flip flops, and logic gates.

3. The PLD of claim 1, wherein each of the plurality of high voltage power transistors is capable of handling a voltage ranging from 12V to 80V and current up to 12 A.

4. The PLD of claim 1, wherein the drain pad and the source pad are connected to an external electric element or device.

5. The PLD of claim 1, wherein the operating characteristics of the power supply include voltage levels, turn-on and turn-off sequences, a switching frequency, a voltage ramp rate, tracking between outputs, protection and monitoring.

6. The PLD of claim 1, wherein a first group of the plurality of high voltage power transistors is coupled to provide a first power switch.

7. The PLD of claim 6, wherein the first power switch is one of a voltage mode buck switching converter, a current mode buck switching converter, a boost regulator, a buck-boost regulator, a low drop-out (LDO) regulator, a load switch, a mux, a battery charger, an external switching controller, a gate driver, and an integrator.

8. The PLD of claim 6, wherein a second group of the plurality of high voltage power transistors is coupled to provide a second power switch, and wherein the first power switch is a first buck converter, and the second power switch is a second buck converter.

9. The PLD of claim 1, wherein the plurality of high voltage power transistors includes a DMOS high voltage power FET integrated to a CMOS circuit.

10. A PLD comprising:
    a programmable fabric including a plurality of logic elements and a plurality of routing channels;
    a plurality of input/output (I/O) blocks; and
    a plurality of high voltage power transistors,
    wherein the PLD is programmed to connect one or more of the plurality of I/O blocks, one or more of the plurality of high voltage power transistors via the programmable fabric,
    wherein each of the plurality of high voltage power transistors includes a drain pad and a source pad that are exposed via external pins of the PLD, and
    wherein a second high voltage power transistor of the plurality of high voltage power transistors is programmed to drive an external high voltage power FET.

11. A PLD comprising:
    a programmable fabric including a plurality of logic elements and a plurality of routing channels;
    a plurality of input/output (I/O) blocks;
    a plurality of high voltage power transistors; and
    a plurality of functional blocks including adaptive blocks,
    wherein the PLD is programmed to connect one or more of the plurality of I/O blocks, one or more of the plurality of high voltage power transistors via the programmable fabric, and
    wherein each of the plurality of high voltage power transistors includes a drain pad and a source pad that are exposed via external pins of the PLD.

12. The PLD of claim 11, wherein the adaptive blocks comprise one or more of an analog-to-digital converter (ADC) block, a comparator block, a memory block, a pulse-width modulation (PWM) block, a voltage reference block, and a timer block.

* * * * *